United States Patent
Lin et al.

(10) Patent No.: US 10,163,912 B2
(45) Date of Patent: Dec. 25, 2018

(54) METHOD FOR SEMICONDUCTOR DEVICE FABRICATION WITH IMPROVED SOURCE DRAIN PROXIMITY

(71) Applicant: Taiwan Semiconductor Manufacturing Co., Ltd., Hsin-Chu (TW)

(72) Inventors: Chih-Han Lin, Hsinchu (TW); Che-Cheng Chang, New Taipei (TW); Horng-Huei Tseng, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/286,795

(22) Filed: Oct. 6, 2016

(65) Prior Publication Data

US 2017/0221906 A1   Aug. 3, 2017

Related U.S. Application Data

(60) Provisional application No. 62/289,009, filed on Jan. 29, 2016.

(51) Int. Cl.
| | |
|---|---|
| H01L 29/66 | (2006.01) |
| H01L 27/11 | (2006.01) |
| H01L 21/3065 | (2006.01) |
| H01L 21/8234 | (2006.01) |
| H01L 29/165 | (2006.01) |
| H01L 27/11582 | (2017.01) |
| H01L 49/02 | (2006.01) |

(52) U.S. Cl.
CPC ...... *H01L 27/1104* (2013.01); *H01L 21/3065* (2013.01); *H01L 21/823418* (2013.01); *H01L 27/11582* (2013.01); *H01L 28/00* (2013.01); *H01L 29/165* (2013.01); *H01L 29/66636* (2013.01)

(58) Field of Classification Search
None
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,299,564 B1 * | 10/2012 | Wu | H01L 21/823814 257/183 |

(Continued)

FOREIGN PATENT DOCUMENTS

| | | |
|---|---|---|
| JP | 2012089784 | 5/2012 |
| KR | 20120034387 | 4/2012 |

(Continued)

*Primary Examiner* — Benjamin Sandvik
(74) *Attorney, Agent, or Firm* — Haynes and Boone, LLP (57) ABSTRACT

A method of forming a semiconductor device includes receiving a substrate with a plurality of gate structures; forming spacers on sidewalls of the gate structures; evaluating a pitch variation to the gate structures; determining an etch recipe according to the pitch variation; performing an etch process to source/drain regions associated with the gate structures using the etch recipe, thereby forming source/drain recesses with respective depths; and performing an epitaxy growth to form source/drain features in the source/drain recesses using a semiconductor material.

20 Claims, 11 Drawing Sheets

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,685,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,871,042 B2 * | 1/2018 | Kim .................. H01L 27/0924 |
| 2008/0248598 A1 | 10/2008 | Pal et al. |
| 2009/0258463 A1* | 10/2009 | Kim ...................... H01L 29/165 |
| | | 438/142 |
| 2010/0109091 A1 | 5/2010 | Griebenow et al. |
| 2011/0294269 A1 | 12/2011 | Wirbeleit et al. |
| 2012/0064686 A1* | 3/2012 | Farber ................. H01L 21/3065 |
| | | 438/285 |
| 2012/0080723 A1* | 4/2012 | Lee .................... H01L 21/26506 |
| | | 257/192 |
| 2012/0097977 A1 | 4/2012 | Yamaguchi |
| 2012/0132996 A1* | 5/2012 | Hwang ........... H01L 21/823807 |
| | | 257/368 |
| 2014/0001574 A1 | 1/2014 | Chen et al. |
| 2014/0110755 A1 | 4/2014 | Colinge |
| 2014/0151812 A1 | 6/2014 | Liaw |
| 2015/0255543 A1* | 9/2015 | Cheng ................. H01L 29/7848 |
| | | 257/288 |
| 2016/0111420 A1* | 4/2016 | Zhang ................. H01L 29/7851 |
| | | 257/392 |
| 2017/0287829 A1* | 10/2017 | Kumar .................. H01L 29/401 |
| 2017/0373189 A1* | 12/2017 | Lee ....................... H01L 21/845 |

FOREIGN PATENT DOCUMENTS

| | | |
|---|---|---|
| TW | 201027749 | 7/2010 |
| TW | 201128714 | 8/2011 |
| TW | 201532276 | 8/2015 |

* cited by examiner

METHOD FOR SEMICONDUCTOR DEVICE FABRICATION WITH IMPROVED SOURCE DRAIN PROXIMITY

PRIORITY DATA

This application claims the benefit of U.S. Prov. App. No. 62/289,009 entitled "Method For Semiconductor Device Fabrication With Improved Source Drain Proximity," filed Jan. 29, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of the typically polysilicon gate electrode with a metal gate electrode to improve device performance with the decreased feature sizes. One process of forming a metal gate stack is termed a replacement-gate or "gate-last" process in which the final gate stack is fabricated "last" which allows for reduced number of subsequent processes, including high temperature processing, that is performed after formation of the gate. Another advancement implemented is strained source and drain for enhanced carrier mobility. However, there are challenges to implementing such IC fabrication processes, especially with scaled down IC features in advanced process nodes, such as N20, N16 and beyond.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
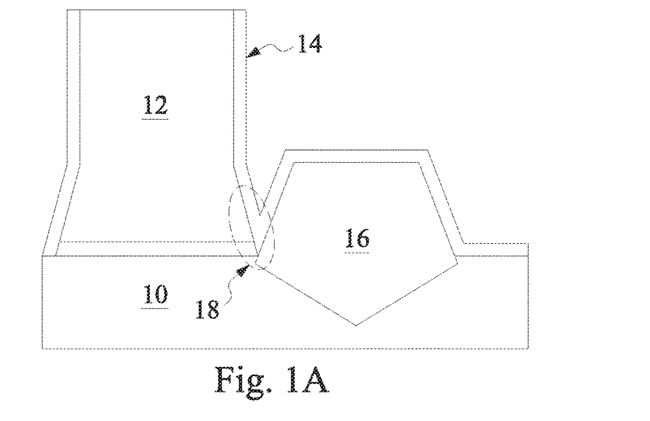
FIGS. 1A, 1B and 1C illustrate some issues that might happen in a gate-last process.
Figure 1B:
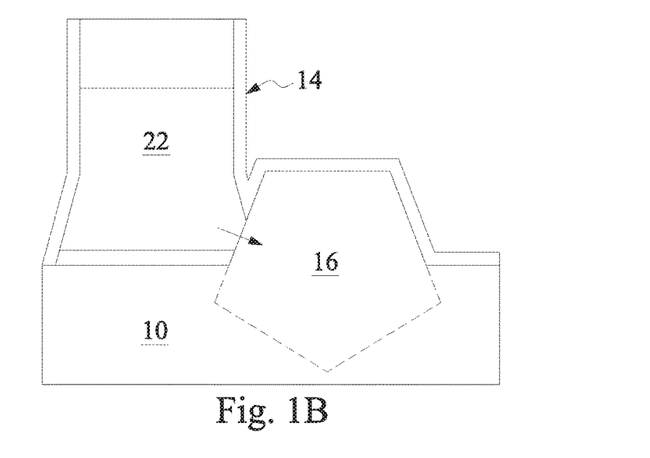
Figure 1C:
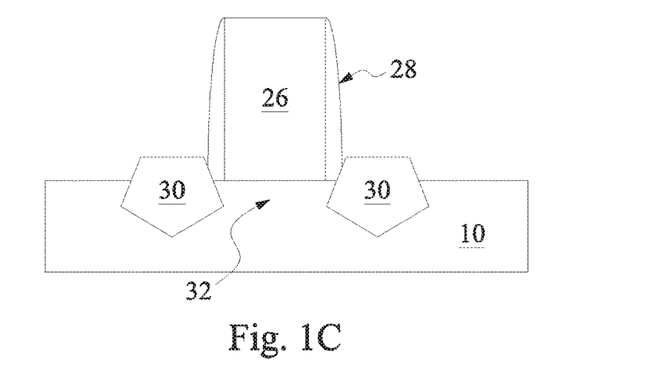

The present disclosure is generally related to methods for semiconductor device fabrication, and more particularly to methods of forming field effect transistors (FETs) using a gate-last process. In a typical gate-last process, a dummy gate structure is formed over a substrate as a placeholder for an actual gate stack. Then gate spacers are formed on sidewalls of the dummy gate structure. Subsequently, the substrate is etched adjacent to the dummy gate structure and the spacera thereby forming recesses in the substrate. Then, doped silicon features are epitaxially grown in the recesses. Thereafter, the dummy gate structure is removed, leaving an opening surrounded by the spacer. Finally, the actual gate stack including metal layers is formed in the opening. As semiconductor process technology advances to smaller regimes, such as 16 nanometer (nm) and beyond, some issues have been found with the above process, which are illustrated in FIGS. 1A-1C. For example, as shown in FIG. 1A, a dummy gate structure 12, formed over a substrate 10, may have footing issues—its lower portion being wider than its upper portion. As a result, a spacer 14, surrounding the dummy gate structure 12, slopes at its lower portion instead of being ideally straight up. When the substrate 10 is etched for growing a doped silicon feature 16, the foot of the spacer 14 might be thinned down or even broken through, as indicated by the dashed circle 18 in FIG. 1A. When this happens, the metal elements in the final gate stack 22 might intrude into the doped silicon feature 16, as shown in FIG. 1B, causing device failures. FIG. 1C illustrates another problem with strained source/drain features in manufacturing FETs, such as fin-like FETs (FinFETs). Referring to FIG. 1C, gate 26 and gate spacer 28 are formed on an active region (e.g., fin-like active region), and source and drain features 30 are epitaxially grown out from two recesses in the (fin-like) active region. The source/drain features 30 surround the gate 26 and the gate spacer 28 and the lower portions of the source/drain features 30 extend to the substrate 10, defining a channel 32 that spans between the source/drain features 30 and is underlying the gate 26. During the formation of the source/drain features 30, there are challenges to control the proximity of the source/drain features 30 to the channel 32 and the gate 26. When the source/drain features are too close to the channel 32, it may form a leakage path in the channel and cause leakage issue. When the source/drain features are too close to the gate 28, it may damage the gate spacer 28 and cause shortage from the source/drain features to the gate 26. The present disclosure provides embodiments of a method for fabricating semiconductor devices and a semiconductor structure made by the same, which overcomes the above issues and enhances the quality of devices thereby formed.

Figure 2:
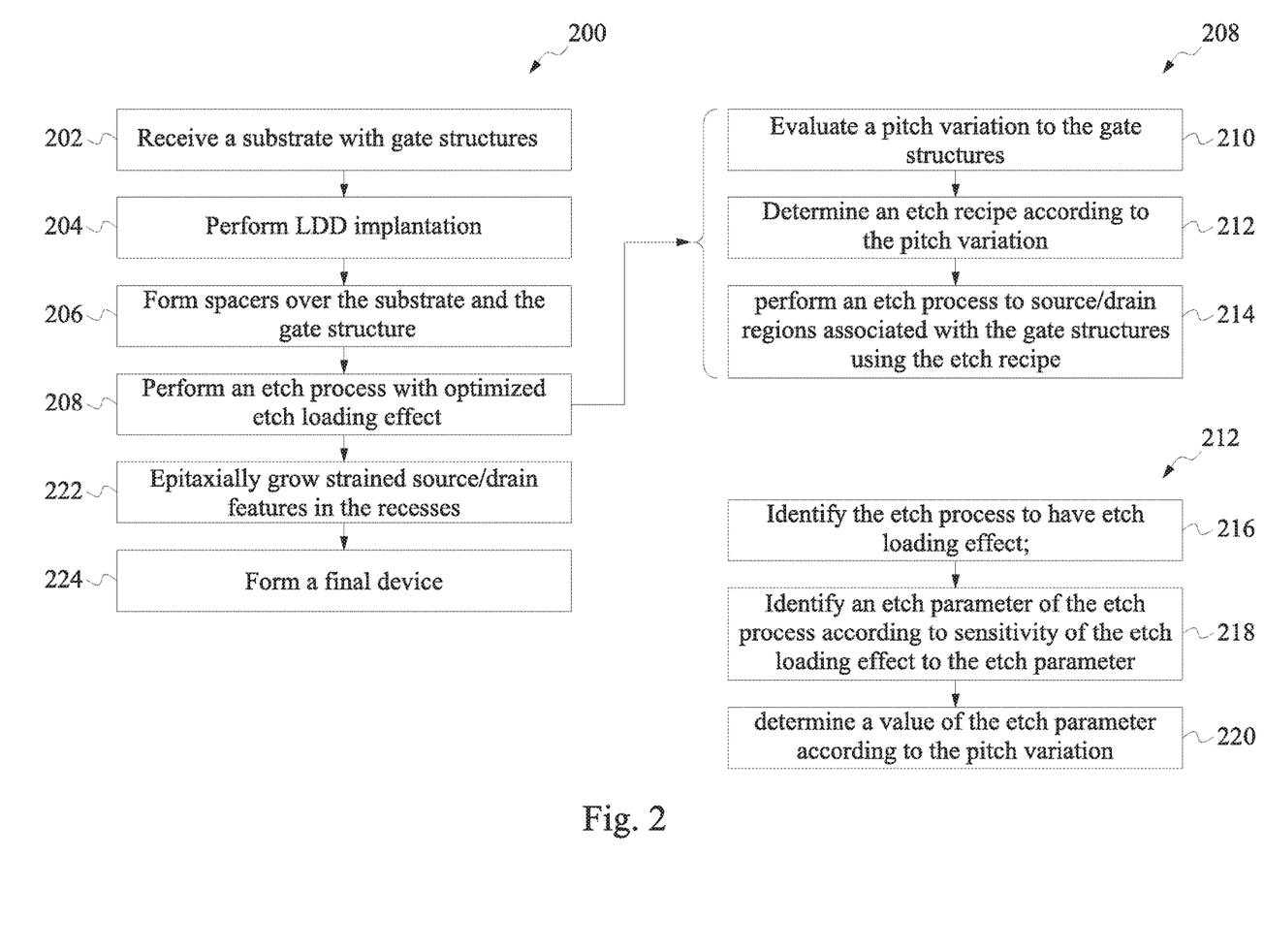
FIG. 2 shows a block diagram of a method of forming a semiconductor device, according to various aspects of the present disclosure.

Referring to FIG. 2, shown therein is a method 200 of forming a semiconductor device according to various aspects of the present disclosure. The method 200 is an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-11 which are side and cross-sectional views of a semiconductor structure 300 according to various aspects of the present disclosure.

As will be shown, the semiconductor structure 300 illustrates two FinFETs in two regions of a substrate. This is provided for simplification and ease of understanding and does not necessarily limit the embodiments to any types of devices, any number of devices, any number of regions, or any configuration of structures of regions. For example, the same inventive concept can be applied in fabricating planar FET devices. Furthermore, the semiconductor structure 300 may be an intermediate device fabricated during processing of an IC, or a portion thereof, that may comprise static random access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 3:
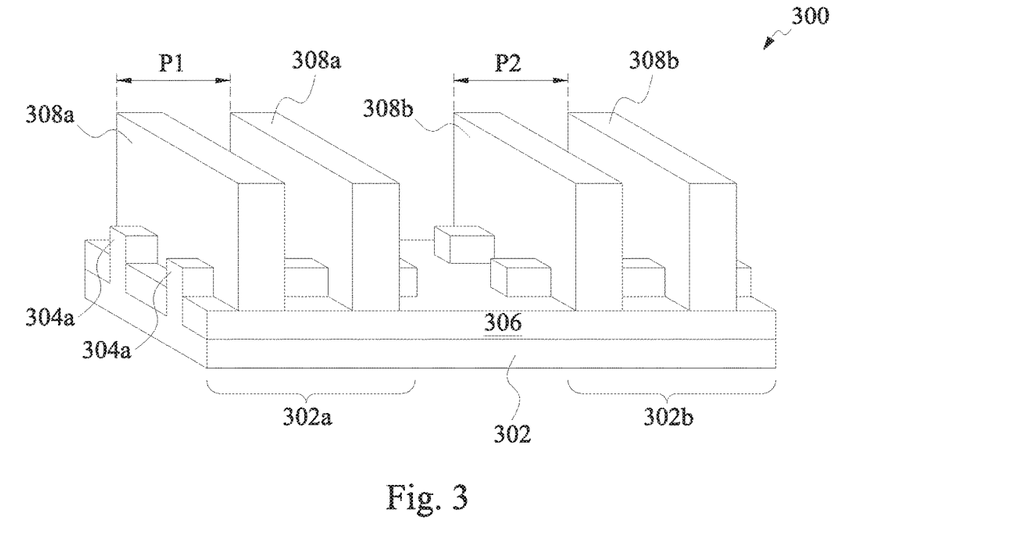
FIGS. 3 and 4 illustrate perspective views of a semiconductor structure at a fabrication stage according to the method of FIG. 2, in accordance with some embodiments.

The method 200 begins at block 202 by receiving a semiconductor structure 300, which includes a substrate 302 with gate structures formed thereon. Referring to FIG. 3, the substrate 302 is a silicon substrate in the present embodiment. Alternatively, the substrate 302 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 302 is a semiconductor-on-insulator (SOI), such as a semiconductor substrate having buried dielectric layer.

In the present embodiment, the substrate 302 includes a first region 302a and a second region 302b. The first region 302a includes two fins-like active regions 304a that are suitable for forming FETs. The second region 302b includes two fins 304b that are suitable for forming PFET devices. The fins 304a/b may be fabricated using a suitable procedure that includes lithography and etch processes. In some embodiments, the fins are formed by a procedure that includes forming shallow trench isolation (STI) features 306; and epitaxy growing a semiconductor material to form the fins. In some embodiments, the fins are formed by a procedure that includes forming shallow trench isolation (STI) features; and recessing STI features to form the fins. In some examples, the formation of the STI features includes a lithography process to form a patterned resist layer; etching an underlying hard mask through the openings of the patterned resist layer; etching the substrate through the openings of the mask to form trenches in the substrate; filling in the trenches with one or more dielectric material; and performing a chemical mechanical polishing (CMP) process to form the STI features. The lithography process may include forming a photoresist (resist) layer over the substrate 302; exposing the resist layer to a pattern, performing post-exposure baking; and developing the resist layer to form the patterned resist layer. In various examples, the etching process can include dry etching, wet etching, reactive ion etching (RIE), and/or other suitable processes. Alternatively, the fins 304a/b may be formed by double-patterning lithography (DPL) process. Numerous other embodiments of methods to form the fins 304a/b on the substrate 302 may be suitable.

The fins active regions 304a and 304b are separated by the STI features 306. The STI features (or an isolation structure) 306 may include silicon oxide, silicon nitride, silicon oxynitride, fluoride-doped silicate glass (FSG), a low-k dielectric material, air gap, and/or other suitable insulating material. The isolation structure may alternatively include other isolation features and is formed by other suitable method. Other isolation structure such as field oxide and/or other suitable structures are possible. The isolation structure 306 may include a multi-layer structure, for example, having one or more thermal oxide liner layers.

Still referring to FIG. 3, the semiconductor structure 300 further includes a plurality of first gate structures 308a and a plurality of second gate structures 308b over the substrate 302. Particularly, the first gate structures 308a are in the first region 302a, engaging with the fins 304a; and the second gate structures 308b are in the second region 302b, engaging with the fins 304b. The gate structures 308a/b may each include a gate dielectric layer, a gate electrode layer, and/or one or more additional layers. In an embodiment, the gate structures 308a/b include polysilicon. In the present embodiment, the gate structures 308a/b are sacrificial gate structures, i.e., placeholder for final gate stacks. The first gate structures 308a are associated with first field effect transistors and the second gate structures 308b are associated with second field effect transistors.

The first gate structures 308a have different dimensions compared with the second gate structures 308b. For example, the first gate structures 308a have a first pitch or a first average pitch if any variation or distribution (collectively referred to as first average pitch P1) and the second gate structures 308b have a second pitch or a second average pitch (collectively referred to as second average pitch P2). The first average pitch is different from the second average pitch. A pitch is defined as a distance from a position of one gate structure to the same location of an adjacent gate structure.

An integrated circuit of the semiconductor structure 300 includes core devices and logic devices. In some embodiments, the core devices may include memory cells, such as static random access memory (SRAM) devices and the logic devices may include input/output (I/O) devices. The core devices and logic devices are designed to have different dimensions, particularly, different pitches. In the present embodiment, the first field effect transistors associated with the first gate structures 308a include core devices and the second field effect transistors associated with the second gate structures 308b include logic devices. In some examples, the first pitch is 90 nm and the second pitch is 200 nm. In some examples, the first pitch is less than 100 nm and the second pitch is greater than 100 nm.

Even though the semiconductor structure 300 illustrated in FIG. 3 include a plurality of the first gate structures 308a and a plurality of the second gate structures 308b, the following figures show only one first gate structure 308a and only one second gate structure 308b, simply for better illustration purpose. For example, FIG. 4 illustrates the semiconductor structure 300 and but shows only one of the first gate structures 308a and one of the second gate structures 308b.

Figure 4:
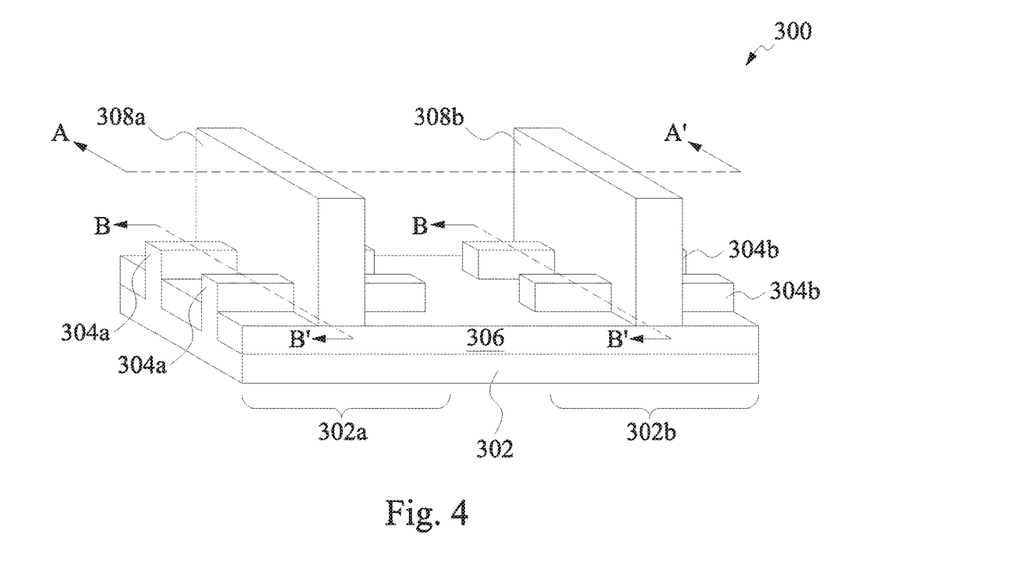
Figure 5A:
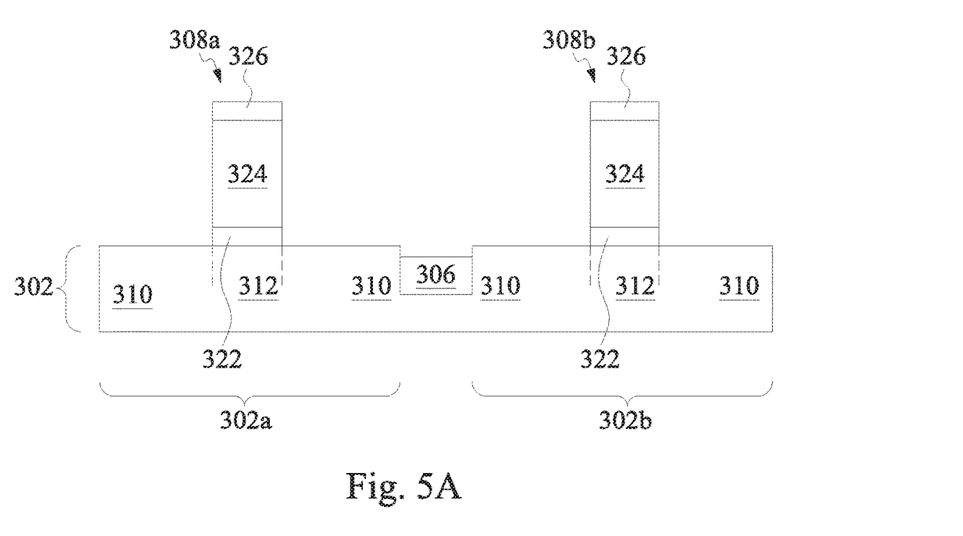
FIGS. 5A, 6A, 7A, 8A, 9A, 10 and 11 illustrate cross sectional views of the semiconductor structure at various fabrication stages according to the method of FIG. 2, in accordance with some embodiments.
Figure 5B:
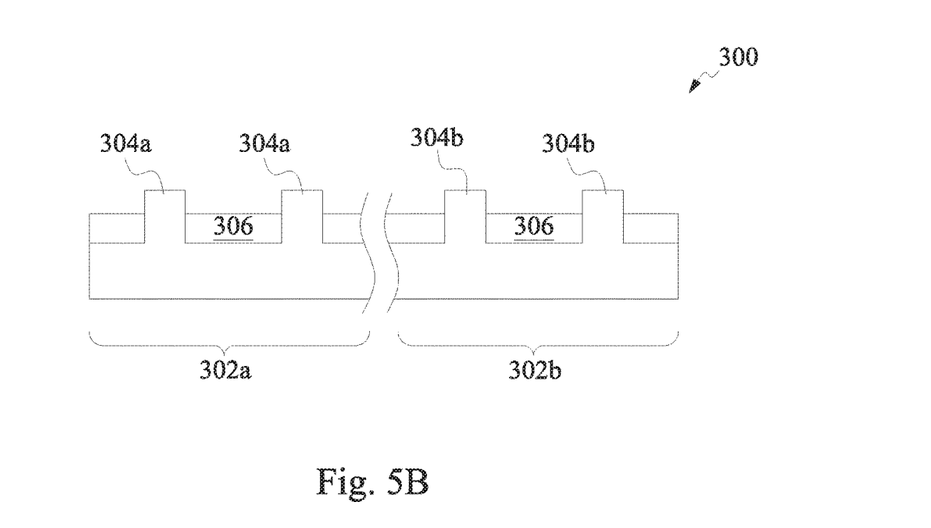
FIGS. 5B, 6B, 7B, 8B and 9B illustrate cross sectional views of the semiconductor structure at various fabrication stages according to the method of FIG. 2, in accordance with some embodiments.

FIG. 5A is a cross-sectional view of the structure 300 along the "A-A'" line of FIG. 4. FIG. 5B is a cross-sectional view of the structure 300 along the "B-B'" lines of FIG. 4, showing both the first and second regions 302a/b in the same drawing. Refer to FIG. 5A, in the present embodiment, the gate structures 308a/b engage with the respective fins 304a/b and effectively divide each fin into three regions— the source/drain regions 310 adjacent to the gate structures 308a/b and the channel region 312 underneath the gate structures 308a/b. For the sake of simplicity, same reference numerals are used to label similar features in the regions 302a and 302b. However, in various embodiments, the features in the regions 302a and 302b, such as the gate structures 308a and 308b as well as the fins 304a and 304b, can be the same or different in material, composition, structure, and/or other aspects.

Still referring to FIG. 5A, in the present embodiment, the gate structures 308a/b each include a gate dielectric layer 322, a gate electrode layer 324, and a hard mask layer 326. In the present embodiment, the gate dielectric layer 322 and the gate electrode layer 324 are also called dummy gate dielectric layer 322 and dummy gate electrode layer 324 respectively because they will be replaced with a final gate stack. The gate dielectric layer 322 may include a dielectric material such as silicon oxide, and may be formed by chemical oxidation, thermal oxidation, atomic layer deposition (ALD), chemical vapor deposition (CVD), and/or other suitable methods. The gate electrode layer 324 may include a single layer or multilayer structure. In an embodiment, the gate electrode layer 324 includes polycrystalline silicon (polysilicon) or amorphous silicon. The gate electrode layer 324 may be formed by suitable deposition processes such as low-pressure chemical vapor deposition (LPCVD) and plasma-enhanced CVD (PECVD). In an embodiment, the gate dielectric layer 322 and the gate electrode layer 324 are first deposited as blanket layers over the substrate 302. Then the blanket layers are patterned through a process including photolithography processes and etching processes thereby removing portions of the blanket layers and keeping the remaining portions over the substrate 302 as the dielectric layer 322 and the gate electrode layer 324. In some embodiment, the hard mask layer 326 is a layer of silicon nitride or silicon oxide. The hard mask layer 326 may be formed by deposition and etching processes similar to those forming the gate dielectric layer 322 and the gate electrode layer 324. In some examples, the hard mask 326 may include two or more films, such as a silicon oxide film and a silicon nitride film.

Referring to FIG. 5B, the first and second regions 302a/b each include two fins, the fins 304a and 304b respectively.

Figure 6A:
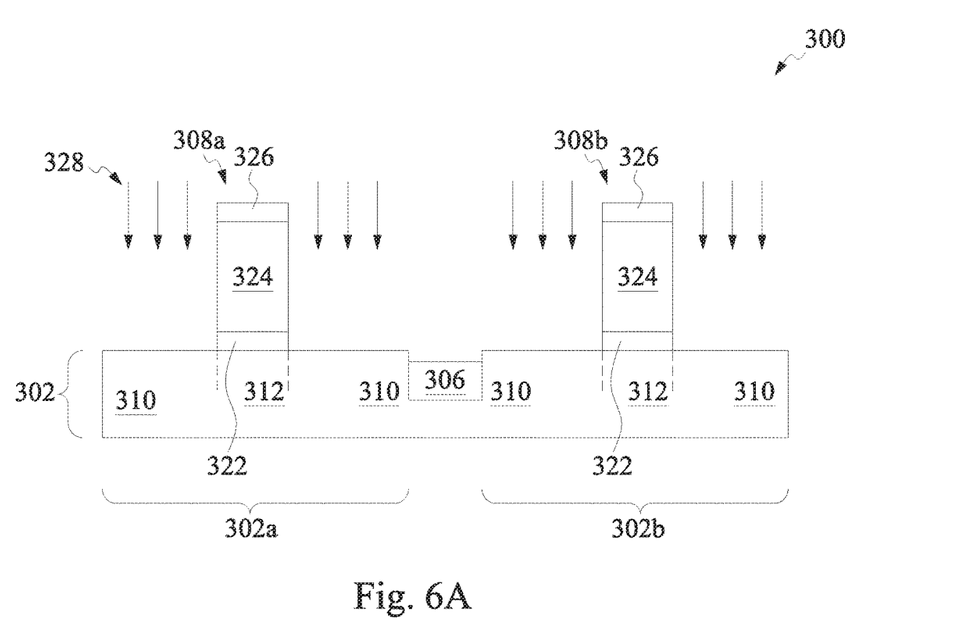
Figure 6B:
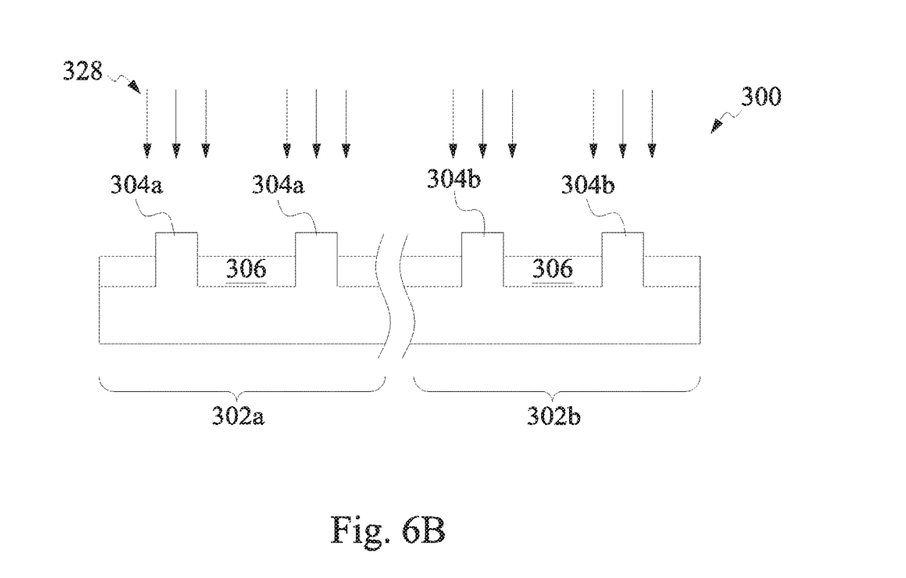

The method 200 (FIG. 2) may proceed to an operation 204 to perform lightly doped source/drain (LDD) ion implantation. The LDD implantation process may utilize n-type dopants, such as phosphorus (P) or arsenic (As), for the NFETs or p-type dopants, such as boron (B) or indium (In), for the PFETs. In the present example, both the first region 302a and the second region 302b are for same type transistors (both are NFETs or PFETs) but with different dimensions. The semiconductor structure 300 may include both NFETs and PFETs for core devices and logic devices even though figures only show one. It is for illustration without limiting. Referring to FIGS. 6A and 6B, an ion implantation 328 is implemented to form lightly doped drains in the substrate 302 and self-aligned with the gate stack (the gate dielectric layer and gate electrode). A mask layer may be used to cover opposite-type regions. For example, when the regions 302a and 302b are regions for PFETs, a mask layer is formed to cover the regions for NFETs. When the regions 302a and 302b are regions for NFETs, a mask layer is formed to cover the regions for PFETs. In some embodiments, the mask layer is a patterned photoresist. In some embodiments, the mask layer is a patterned hard mask of a material, such as silicon oxide, silicon nitride, silicon oxynitride or a combination thereof. The mask layer is removed after the LDD implantation has completed in the regions 302a and 302b. A similar masking element is formed to cover the regions 302a/302b when the opposite regions undergo the LDD implantation.

Figure 7A:
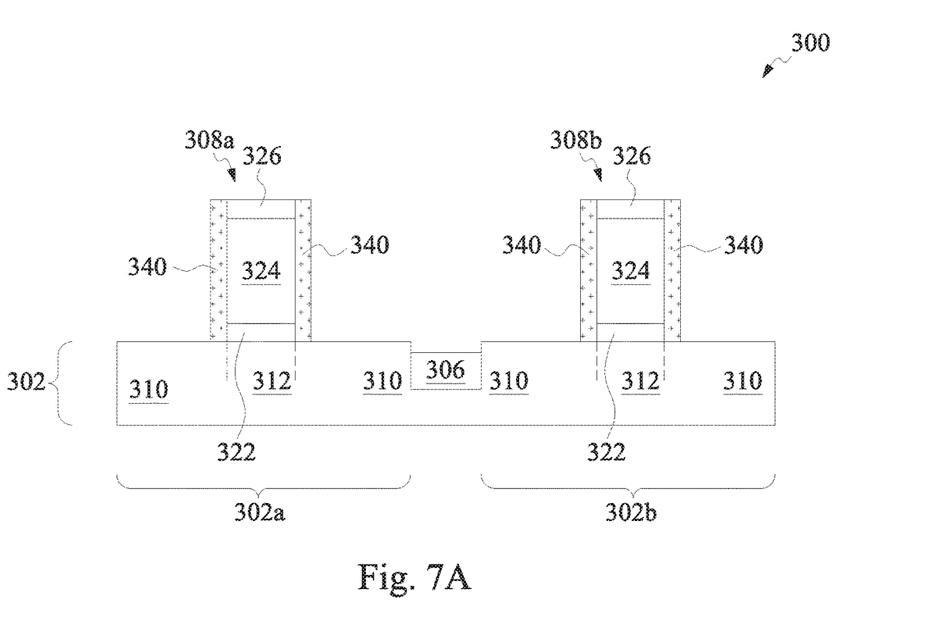
Figure 7B:
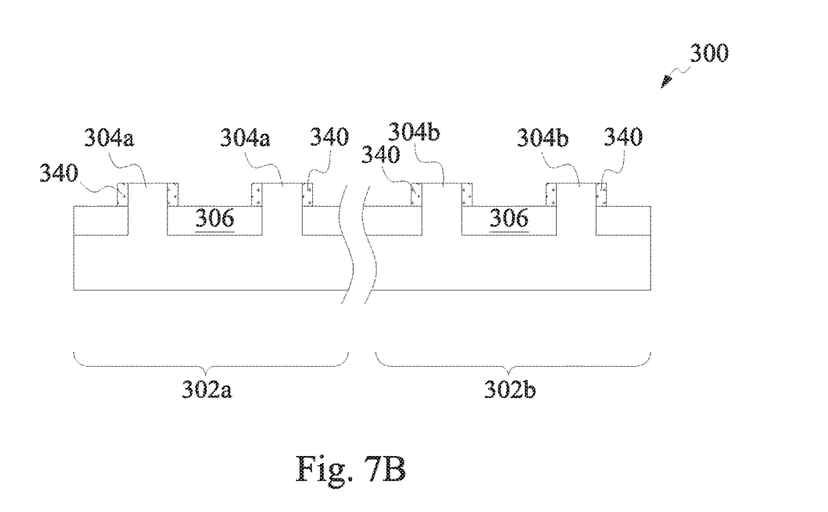

The method 200 proceeds to an operation 206 to form spacers 330 over the substrate 302 and the gate structures 308a/b. Referring to FIGS. 7A and 7B, the spacers 340 are formed on sidewalls of the gate structures. The spacers 340 include a dielectric material, such as silicon oxide, silicon nitride, silicon oxynitride, silicon carbon nitride or a combination thereof. The spacers 340 may include multiple films, such as a silicon oxide film and a silicon nitride film. In an embodiment, the spacers 340 have a thickness in a range from about 2 to about 10 nm. The formation of the spacers 340 may include deposition and anisotropic etch. In some examples, the deposition may include CVD, ALD, or other suitable methods. In some examples, the isotropic etch may include a dry etch, such as a plasma etch with bias with a suitable etchant, such as $CF_4$, $SF_6$, $NF_3$, $CH_2F_2$ or a combination thereof.

Figure 8A:
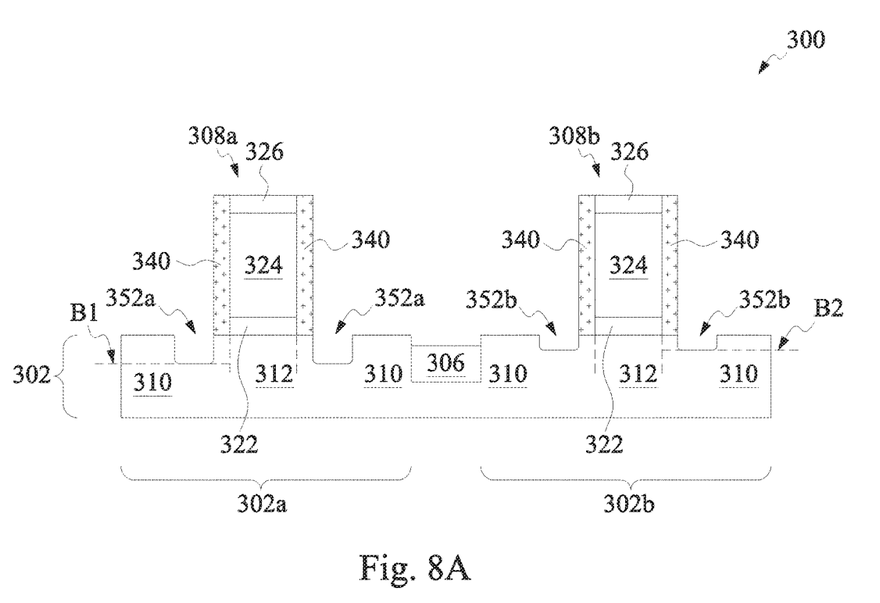
Figure 8B:
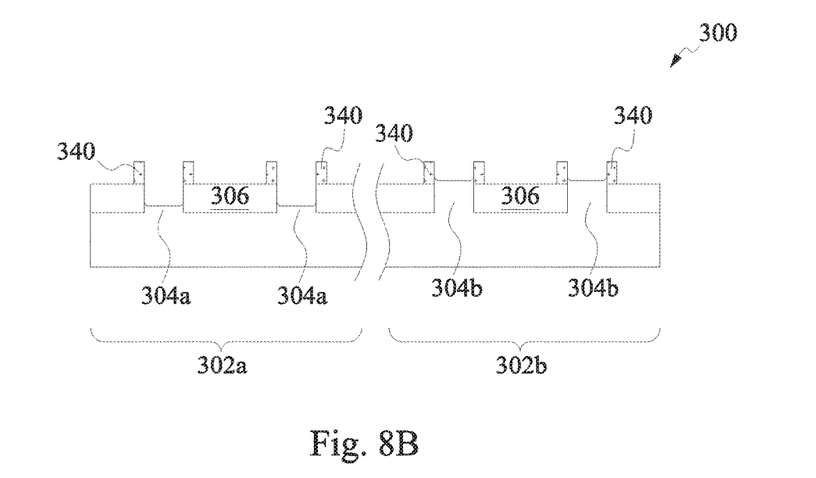

The method 200 proceeds to an operation 208 by performing an etch process with optimized etch loading effect to first source/drain regions 350a and second source/drain regions 350b, thereby forming first recesses 352a in the first source/drain regions 350a and second recesses 352b in the second source/drain regions 350b, respectively. Particularly, due to the optimized etch loading effect, the first recesses 352a are different from the second recesses 352b. Referring to FIGS. 8A and 8B, the first recesses 352a are formed in the first source/drain regions 310 adjacent to the gate structure 308a and the spacers 340. The first recesses 352a have a first depth and a first bottom surface B1. The second recesses 352b are formed in the second source/drain regions 310 adjacent to the gate structure 308b and the spacers 340. The second recesses 352b have a second depth and a second bottom surface B2. The second bottom surface B2 is higher than the first bottom surface B1.

Since the core device has smaller pitches and smaller operational voltages than the logic devices, the strained source and drain features can be formed more close to the gate structures and channels. Therefore, the etch loading effect is designed to have higher etch rates to the first region 302a associated with the first gate structures 308a with the first average pitch than the etch rates to the second region 302b associated with the second gate structures 308b with the second average pitch. Accordingly, the first recesses 352a are laterally more close to the corresponding first gate structures 308a than the second recesses 352b to the corresponding second gate structures 308b. Thus, by one etch process, both first and second recesses 251a/352b are formed with respective depth and other dimensions. The recesses 352a/362b may have vertical sidewalls, tapered sidewalls, or other profiles.

The operation 208 to perform the etch process with optimized etch loading effect may be implemented with following procedure in accordance with some embodiments. Referring to FIG. 2, the procedure includes an operation 210 to evaluate a pitch variation to the gate structures on the substrate. Since the semiconductor structure 300 includes gate structures with different pitches, a pitch variation is first evaluated. In some examples, a pitch criteria, such as 100 nm, may be first chosen according to production specification and/or engineering experience. Then the gate structures are categorized to two groups: a first group with pitches less than the pitch criteria and a second group with pitches greater than the pitch criteria. In the present example, the first group includes the first gate structures 308a and the second group includes the second gate structures 308b. Then average pitches are determined to each group. In the present example, the result is the first average pitch to the first gate structure 308a and the second average pitch to the second gate structure 308b. A pitch ratio R is determined as the second average pitch P2 over the first average pitch P1, R=P2/P1. The pitch ratio R is used as the pitch variation in the present embodiment.

The procedure further includes an operation 212 to determine the etch recipe according to the pitch variation. In some embodiments, the operation 212 may further includes a sub-operation 216 to identify the etch process to have etch loading effect. For example, the etching process may be chosen as dry (plasma) etching with an etchant that includes a fluorine-containing gas, a chlorine-containing gas, oxygen, hydrogen or a combination thereof. The etching process may further use a carrying gas such as argon or helium. In various examples, the etchant includes $CF_4$, $SF_6$, $NF_3$, $CH_2F_2$, $Cl_2$, $CCl_2F_2$ or a combination thereof. In one example, the etchant includes a combination of HBr/Cl2/O2/He. The operation 212 also includes a sub-operation 218 to identify one or more etch parameter of the etch process according to sensitivity of the etch loading effect to the etch parameter. In various examples, the sensitive etch parameter includes plasma power, gas pressure, plasma bias, gas flow rate, or a combination. The operation 212 further includes a sub-operation 220 to determine a value of the etch parameter according to the pitch variation. The one (or more) sensitive etch parameter is constructed as a function (such as linear function or polynomial function) of the pitch variation according to fabrication historic data and engineer experience. In some embodiments, the sensitive etch parameter is plasma power. In this case, when the pitch variation is greater, the plasma power is increased accordingly. Alternatively, the gas pressure is determined as the sensitive etch parameter. In this case, when the pitch variation is greater, the gas pressure is increased accordingly. In one example, both plasma power and gas pressure are collectively determined as the sensitive etch parameters, with the first gate structure 308a having the first average pitch 90 nm and the second gate structure 308b having the second average pitch 200 nm, the plasma power is determined in a range between 600 W and 800 W, and the gas pressure is determined in a range between 100 mT and 200 mT. Thus, the etch recipe is determined.

The operation 208 then proceeds to the block 214 to perform the identified etching process using the etch recipe with the etch parameter(s) determined according to the pitch variation. In the present embodiments, the etching process is a plasma etching process as described above. In some cases, the first recesses 352a are etched relatively close to the corresponding spacers 340 than the second recesses 352b.

Figure 9A:
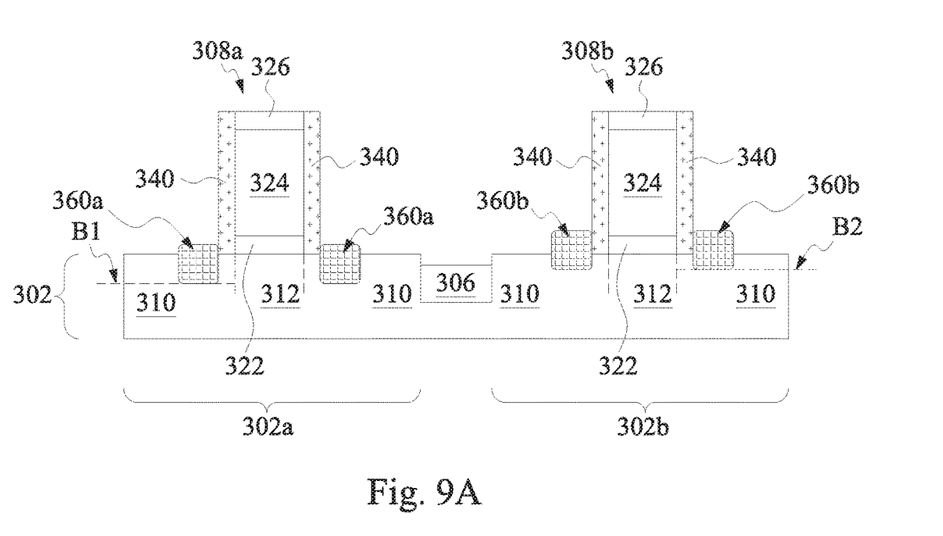
Figure 9B:
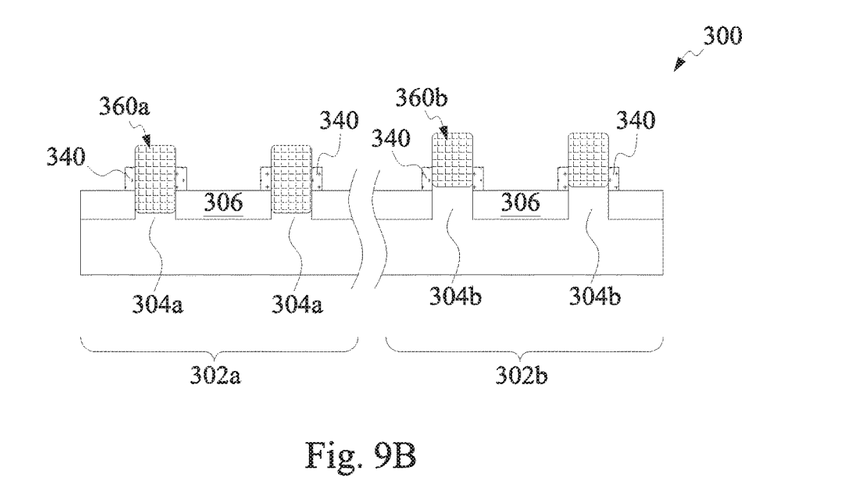

The method 200 then proceeds to operation 222 to epitaxially grow with a semiconductor material in the recesses to form strained source/drain features 360a and 360b in the recesses 352a and 352b, respectively, as shown in FIGS. 9A and 9B. In an embodiment, the epitaxial growth process is a low pressure chemical vapor deposition (LPCVD) process using a silicon-based precursor gas. Further, in the present example, the epitaxial growth process in-situ dopes the grown S/D features with an n-type dopant such as P, As, or combinations thereof for forming the source/drain features for NFETs or a p-type dopant such as B for forming the source/drain features for PFETs. In some examples, for PFETs, the semiconductor material epitaxially grown is silicon germanium, germanium or a combination. For NFETs, the semiconductor material epitaxially grown is silicon carbon, silicon or a combination. Accordingly, the S/D features 360a and 360b have similar configuration and dimensions to the recesses. For example, the first S/D features 360a have a bottom surface lower than that of the second S/d features 360b. The S/D features 360a and 360b are grown in close proximity to the channel region 312, thus providing strain to the channel region 312 and enhancing carrier mobility thereof.

Figure 10:
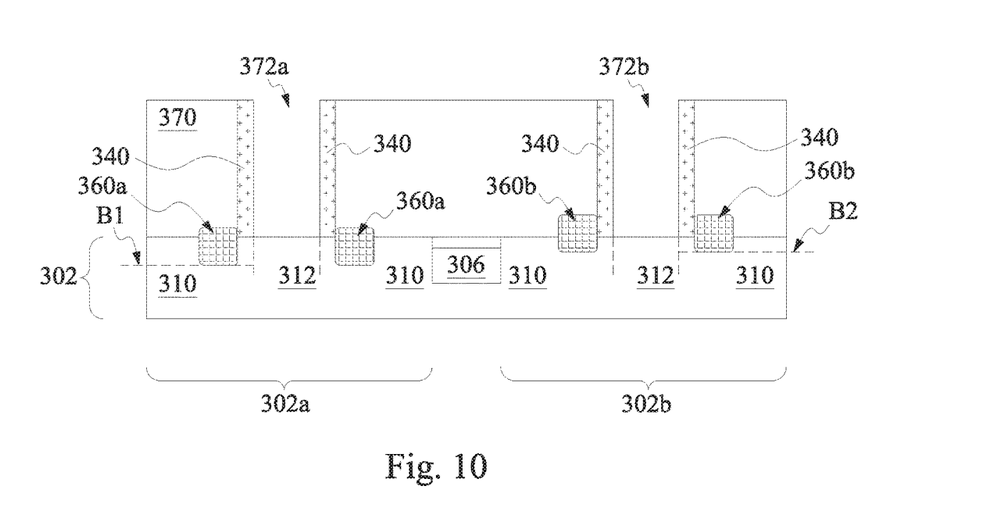

The method 200 may include other operations. In an embodiment, the method 200 further includes an operation 224 to replace the gate structure 308a and/or 308b with a high-k metal gate stack. Referring to FIG. 10, an inter-layer dielectric (ILD) layer 370 is formed over substrate 302 in the first region 302a and the second region 302b by a procedure, such as deposition and CMP. In an embodiment, the ILD layer 370 is formed by a flowable CVD (FCVD) process. The FCVD process includes depositing a flowable material (such as a liquid compound) on the substrate 302 to fill the gaps between the gate structures and converting the flowable material to a solid material by a suitable technique, such as annealing in one example. Then, a CMP process is performed to the ILD layer 370 to expose the gate structures 308a/308b. Subsequently, the gate structures 308a/308b are removed by one or more selective etching processes thereby forming a first opening 372a in the first region 302a and a second opening 372b in the second region 302b. The spacers 340 remain during the etch process. Those openings 372a/372b are at least partially surrounded by the corresponding spacers 340.

Figure 11:
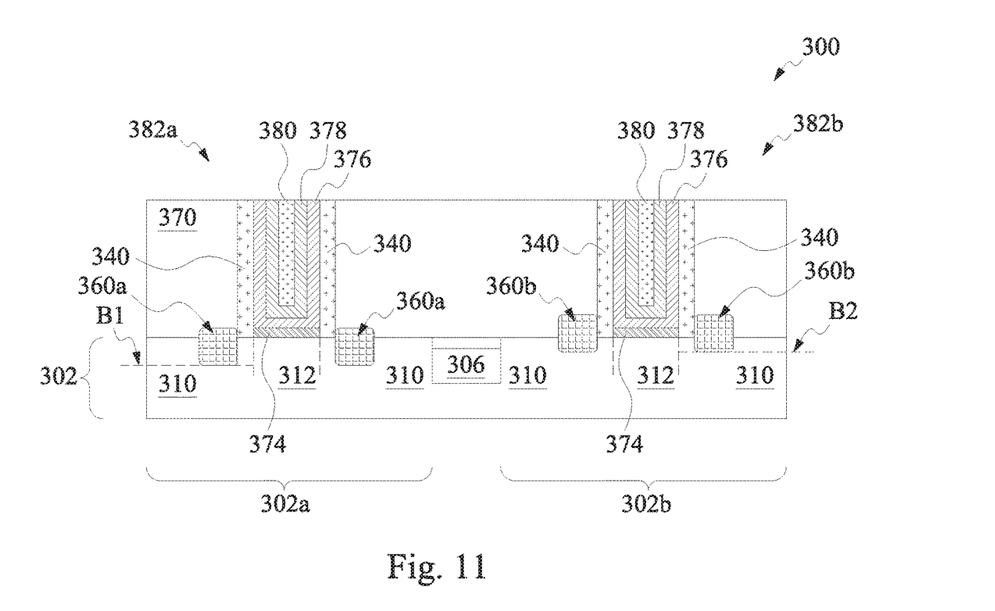

Referring to FIG. 11, one or more material layers are deposited into the openings 372a/372b to complete the gate-last process. In the example shown in FIG. 11, the final gate stacks 382a and 382b include an interfacial layer 374, a dielectric layer 376, a work function metal layer 378, and a fill layer 380. The interfacial layer 374 may include a dielectric material such as silicon oxide, and may be formed by chemical oxidation, thermal oxidation, ALD, CVD, and/ or other suitable dielectric. The dielectric layer 376 may include a high-k dielectric layer such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material. The dielectric layer 376 may be formed by ALD and/or other suitable methods. In the present embodiment, the work function metal layer 378 is an n-type work function layer for NFETs (or a p-type work function layer for PFETs), and may be deposited by CVD, PVD, and/or other suitable process. The fill layer 380 may include aluminum (Al), tungsten (W), or copper (Cu) and/or other suitable materials, and may be formed by CVD, PVD, plating, and/or other suitable processes. A CMP process may be performed to remove excess materials from the gate stacks and to planarize a top surface of the semiconductor structure 300. Further processes, such as contact and via formation, interconnect processing, etc., may be performed subsequently to complete the fabrication of the semiconductor structure 300.

Figure 12:
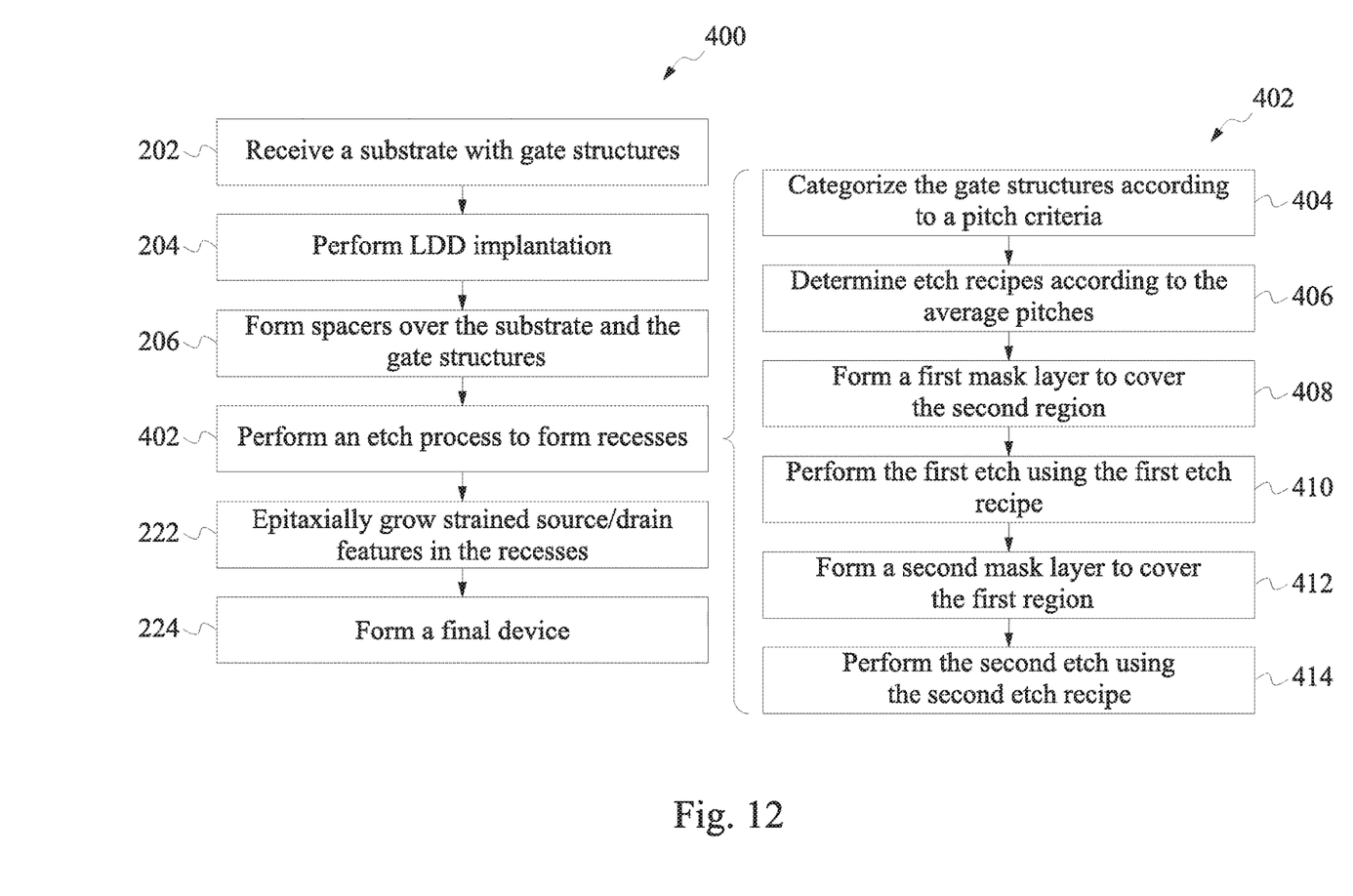
FIG. 12 shows a block diagram of a method of forming a semiconductor device, according to various aspects of the present disclosure.

Referring to FIG. 12, shown therein is a method 400 of forming a semiconductor device according to various aspects of the present disclosure in some other embodiments. The method 400 is an example, and is not intended to limit the present disclosure beyond what is explicitly recited in the claims. Additional operations can be provided before, during, and after the method 400, and some operations described can be replaced, eliminated, or moved around for additional embodiments of the method. The method 400 is described below in conjunction with FIGS. 13-14 which are side and cross-sectional views of a semiconductor structure 300 according to various aspects of the present disclosure.

The method 400 is similar to the method 200 but the etching process is different. The method 400 includes an operation 402 to perform an etch process to form recesses in the S/D regions. Particularly, the etch process includes two etch steps to form the first recesses 352a and the second recesses 352b, respectively. The operation 402 also includes forming patterned mask layers so that each etch step is implemented using the corresponding mask layer as etch mask.

In some embodiments, the operation 402 includes evaluating the pitch variation of the gate structures since the semiconductor structure 300 includes gate structures with different pitches. In some examples, a pitch criteria, such as 100 nm, may be first chosen according to production specification and/or engineering experience. The operation 402 includes a sub-operation 404 that categorizes the gate structures into two groups: a first group with pitches less than the pitch criteria and a second group with pitches greater than the pitch criteria. In the present example, the first group includes the first gate structures 308a and the second group includes the second gate structures 308b. Average pitches may be determined to each group. In the present example, the result is the first average pitch to the first gate structure 308a and the second average pitch to the second gate structure 308b.

The operation 402 may proceed to a sub-operation 406 to determine a first etch recipe to the first region 302a having the first gate structures 308a and a second etch recipe to the second region 302b having the second gate structures 308b. In the sub-operation 406, one or more etch parameter is determined according to the respective average pitch to achieve the similar structure and dimensions of the recesses as by the method 200. The etch parameters for this purpose may include etch duration, etch gas flow rate, gas pressure, plasma power, plasma bias and a combination thereof. For example, the etch duration is chosen as the etch parameter. The etch duration has a first value to the first etch recipe and a value to the second etch recipe, in which the first value of the etch duration is longer than the second value of the etch duration. When the two average pitch different is greater, thus determined values of the etch duration have a greater different. This is similar to other etch parameters. In the present example, more than one etch parameters are collectively determined according to the average pitch for each group of the gate structures.

Figure 13:
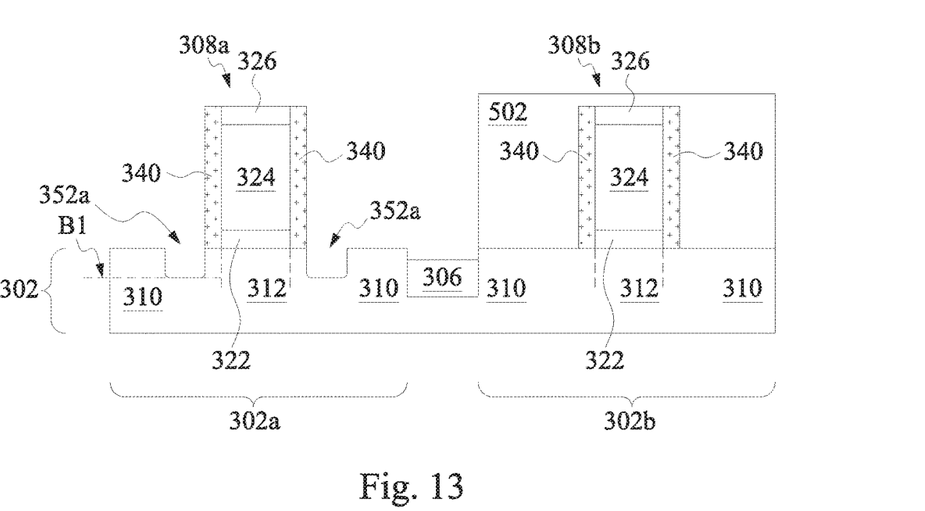
FIGS. 13 and 14 illustrate cross sectional views of the semiconductor structure at various fabrication stages according to the method of FIG. 12, in accordance with some embodiments.

Then the operation 402 may proceed to a sub-operation 408 to form a first patterned mask layer 502 to cover the second region 302b, as illustrated in FIG. 13. The formation of the first mask layer is similar to the procedure to form a mask layer described above. For example, the first mask layer includes a patterned resist layer formed by a lithography process.

The operation 402 proceeds to a sub-operation 410 to perform a first etch step using the first etch recipe, thereby forming the first recesses 352a, as illustrated in FIG. 13. The first mask layer 502 is removed thereafter.

Figure 14:
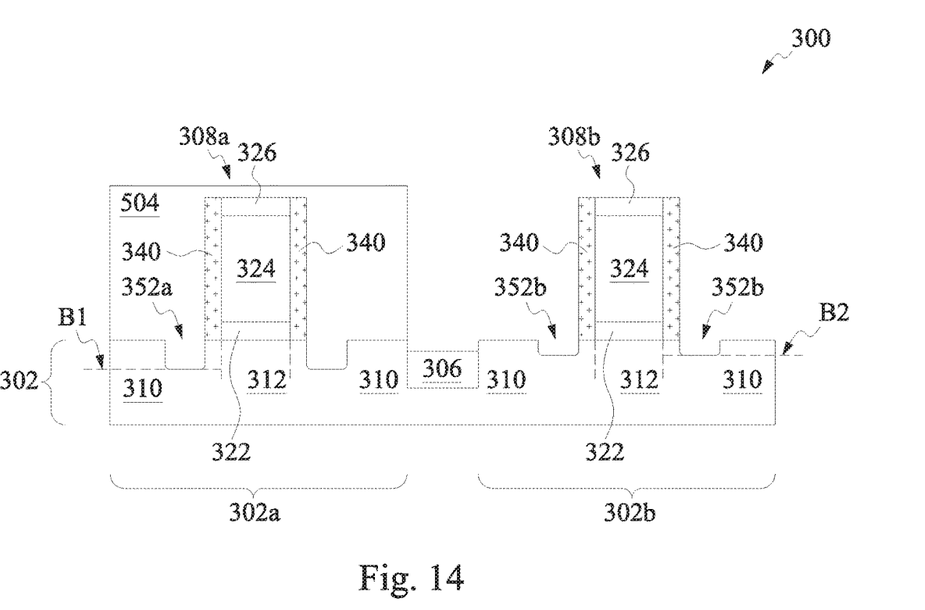

The operation 402 proceeds to a sub-operation 412 to form a second patterned mask layer 504 to cover the second region 302b, as illustrated in FIG. 14. The formation of the second mask layer is similar to the formation of the first mask layer 502.

The operation 402 proceeds to a sub-operation 414 to perform a second etch step using the second etch recipe, thereby forming the second recesses 352b, as illustrated in FIG. 14. The second mask layer 504 is removed thereafter, with the resulting structure illustrated in FIGS. 8A and 8B.

The operation 402 may have a different sequence. For example, the sub-operations 406 and 408 may be switched with the sub-operations 410 and 412 so that the second recesses 352b are formed first and the first recesses 352a are formed thereafter. After the completion of the operation 402, the method 400 process then proceeds to the operation 222.

The present disclosure provides a semiconductor structure and a method making the same. By utilizing the disclosed method, such as method 200 or method 400, the first strained source/drain features 360a are formed differently from the second strained source/drain features 360b. For example, the bottom surface of the first strained S/D features 360a having a smaller (average) pitch is lower than the bottom surface of the second strained S/D features 360b having a greater (average) pitch.

The embodiments of the present disclosure offer advantages over existing art, though it is understood that other embodiments may offer different advantages, not all advantages are necessarily discussed herein, and that no particular advantage is required for all embodiments. Various advantages may present in some embodiments. By utilizing the disclosed semiconductor structure and the method, the field effect transistors are tailed with respective dimensions according the respective circuit specification with improved source drain proximity and improved device performance, without device leakage issues. By utilizing the method 200, a single etch process to form various field effect transistors of different pitches with respective configurations and dimensions, reducing the fabrication cycle time and manufacturing cost.

Although not intended to be limiting, one or more embodiments of the present disclosure provide many benefits to a semiconductor device and the formation thereof. For example, when the dummy gates are removed, the substrate is further recessed into the channel regions. For another example, in a FinFET fabrication process, spacers on sidewalls of fins include more than one films and may use different material for enhanced etch resistance. In yet another example, the strained source/drain features may be epitaxially grown to be coplanar with the top surface of the substrate or above the substrate.

In one exemplary aspect, the present disclosure is directed to a method of forming a semiconductor structure. The method includes receiving a substrate with a plurality of gate structures; forming spacers on sidewalls of the gate structures; evaluating a pitch variation to the gate structures; determining an etch recipe according to the pitch variation; performing an etch process to source/drain regions associated with the gate structures using the etch recipe, thereby forming source/drain recesses with respective depths; and performing an epitaxy growth to form source/drain features in the source/drain recesses using a semiconductor material.

In one exemplary aspect, the present disclosure is directed to a method of forming a semiconductor structure. The method includes receiving a substrate with a plurality of gate structures; forming spacers on sidewalls of the gate structures; categorizing the gate structures according a pitch criteria, thereby grouping the gate structures into a first subset of the gate structures with pitches less than the pitch criteria and a second subset of the gate structures with pitches greater than the pitch criteria; determining a first etch recipe and a second etch recipe according to a first average pitch of the first subset of the gate structures and a second average pitch of the second subset of the gate structures, respectively; performing a first etch process to first source/drain regions associated with the first subset of the gate structures using the first etch recipe, thereby forming first recesses; and performing a second etch process to second source/drain regions associated with the second subset of the gate structures using the second etch recipe, thereby forming second recesses.

In one exemplary aspect, the present disclosure is directed to a semiconductor structure. The semiconductor structure includes a semiconductor substrate having a first region and a second region; first gate stacks in the first region and second gate stacks in the second region, wherein the first gate stacks have a first pitch and the second gate stacks have a second pitch greater than the first pitch; first source/drain features associated with the first gate stacks, respectively, forming first field effect transistors; and second source/drain features associated with the second gate stacks, respectively, forming second field effect transistors, wherein the first source/drain features have a first bottom surface, the second source/drain features have a second bottom surface above the first bottom surface.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   receiving a substrate with a plurality of gate structures;
   forming spacers on sidewalls of the gate structures;
   evaluating a pitch variation to the gate structures;
   determining an etch recipe according to the pitch variation;
   performing an etch process to source/drain regions associated with the gate structures using the etch recipe, thereby forming source/drain recesses with respective depths, wherein the performing of the etch process to source/drain regions includes performing a plasma etch process that increases at least one of plasma power and gas pressure as the pitch variation is increased; and
   performing an epitaxy growth to form source/drain features in the source/drain recesses using a first semiconductor material.

2. The method of claim 1, wherein the determining of the etch recipe includes:
   identifying the etch process to have etch loading effect;
   identifying an etch parameter of the etch process according to sensitivity of the etch loading effect to the etch parameter; and
   determining a value of the etch parameter according to the pitch variation.

3. The method of claim 2, wherein the identifying of the etch process includes selecting the plasma etch process with an etchant that includes one of a fluorine-containing chemical, a chlorine-containing chemical, and a combination thereof.

4. The method of claim 3, wherein the identifying an etch parameter of the etch process includes selecting at least one of plasma power and gas pressure.

5. The method of claim 1, wherein the substrate includes a second semiconductor material; and the first semiconductor material is different from the second semiconductor material.

6. The method of claim 5, wherein the second semiconductor material is silicon and the first semiconductor material is silicon germanium.

7. The method of claim 1, wherein the evaluating of the pitch variation to the gate structures includes determining a pitch ratio as the pitch variation, wherein the determining of the pitch ratio includes:
   categorizing the gate structures according a pitch criteria, thereby grouping the gate structures into a first subset of the gate structures with pitches less than the pitch criteria and a second subset of the gate structures with pitches greater than the pitch criteria;
   determining a first average pitch to the first subset of the gate structures and a second average pitch to the second subset of the gate structures; and
   determining the pitch ratio as a ratio of the second average pitch over the first average pitch.

8. The method of claim 7, wherein
   the source/drain regions include first source/drain regions associated with the first gate structure, and second source/drain regions associated with the second gate structure; and
   the etch loading effect of the etch process includes that the etch process has a first etch rate to the first source/drain regions and has a second etch rate to the second source/drain regions, wherein the first etch rate is greater than the second etch rate.

9. The method of claim 8, wherein
   the etch process includes a first etch and a second etch;
   the determining of the etch recipe according to the pitch variation includes determining a first sub-recipe to the first etch and a second sub-recipe to the second etch; and the performing of the etch process to the source/drain regions includes applying the first etch to the first source/drain regions using the first sub-recipe and applying the second etch to the second source/drain regions using the second sub-recipe.

10. The method of claim 1, wherein the performing of the etch process to source/drain regions associated with the gate structures using the etch recipe incudes forming a first source/drain recess and a second source/drain recess during the same single etching process, and
wherein the first source/drain recess extends further into the substrate than the second source/drain recess.

11. A method of forming a semiconductor device, comprising:
receiving a substrate with a plurality of gate structures;
forming spacers on sidewalls of the gate structures;
categorizing the gate structures according a pitch criteria, thereby grouping the gate structures into a first subset of the gate structures with pitches less than the pitch criteria and a second subset of the gate structures with pitches greater than the pitch criteria;
determining a first etch recipe and a second etch recipe according to a first average pitch of the first subset of the gate structures and a second average pitch of the second subset of the gate structures, respectively;
performing a first etch process to first source/drain regions associated with the first subset of the gate structures using the first etch recipe, thereby forming first recesses; and
performing a second etch process to second source/drain regions associated with the second subset of the gate structures using the second etch recipe, thereby forming second recesses, and
wherein the performing of the first and second etch processes includes performing a plasma etch that includes increasing at least one of plasma power and gas pressure as a pitch variation is increased amongst the gate structures.

12. The method of claim 11, wherein
the performing of the first etch process includes forming the first recesses having a first average depth;
the performing of second etch process includes forming the second recesses having a second average depth; and
the second average depth is less than the first average depth.

13. The method of claim 11, further comprising performing an epitaxy growth to form source/drain features in the first and second recesses using a first semiconductor material, wherein the substrate includes a second semiconductor material being different from the first semiconductor material in composition.

14. The method of claim 11, further comprising
forming a first hard mask that uncovers the first source/drain regions and covers the second source/drain regions, wherein the performing of the first etch process includes performing the first etch process using the first hard mask as etch mask;
removing the first hard mask; and
forming a second hard mask that uncovers the second source/drain regions and covers the first source/drain regions, wherein the performing of the second etch process includes performing the second etch process using the second hard mask as etch mask.

15. The method of claim 11, wherein the determining of the first etch recipe and the second etch recipe includes determining at least one etch parameter of the first etch recipe to have a value and the etch parameter of the second etch recipe to have a second value different from the first value.

16. The method of claim 15, wherein each of the first and second etch processes includes plasma etch with an etchant selected from the group consisting of fluorine, chlorine, oxygen, hydrogen, and a combination thereof.

17. A method comprising:
forming a first set of first gate structures and a second set of second gate structures on a substrate;
determining an etch recipe based on a first average pitch of the first set of first gate structures and a second average pitch of the second set of second gate structures;
etching the substrate, according the etch recipe, adjacent one of the first gate structures associated with the first set of gate structures to form a first recess and etching the substrate, according the etch recipe, adjacent one of the second gate structures associated with the second set of gate structures to form a second recess, wherein the etching of the substrate adjacent the one of the first gate structures associated with the first set of gate structures to form the first recess and the etching of the substrate adjacent the one of the second gate structures associated with the second set of gate structures to form the second recess occurs during the same single etching process, and wherein the first recess extends further into the substrate than the second recess; and
forming a first source/drain feature in the first recess and a second source/drain feature in the second recess.

18. The method of claim 17, wherein the etching of the substrate adjacent the one of the first gate structures associated with the first set of gate structures includes performing a plasma etch process with an etchant.

19. The method of claim 18, wherein the etchant one of a fluorine-containing chemical, a chlorine-containing chemical, and a combination thereof.

20. The method of claim 17, wherein the first source/drain feature and the second source/drain are formed of the same material.

* * * * *